(12) United States Patent
Laouenan et al.

(10) Patent No.: US 9,409,167 B2
(45) Date of Patent: Aug. 9, 2016

(54) FABRICATION METHOD OF MICROFLUIDIC DEVICES

(75) Inventors: Florian Laouenan, ArrasteMondragon-Guipuzcoa (ES); Inigo Aranburu, Zarautz (ES); Maria Agirregabiria, Deba (ES); Jorge Elizalde, San Sebastian (ES); Javier Berganzo, Vitoria (ES); Jesus Ruano, Alava (ES); Luis J. Fernandez, Maria de Huerva (ES); Aitor Ezkerra, Vizcaya (ES)

(73) Assignee: IKERLAN, S.COOP, Mondragon, Guipuzcoa (ES)

( * ) Notice: Subject to any disclaimer, the term of this patent is extended or adjusted under 35 U.S.C. 154(b) by 569 days.

(21) Appl. No.: 13/808,853

(22) PCT Filed: Apr. 25, 2011

(86) PCT No.: PCT/ES2011/070291
§ 371 (c)(1),
(2), (4) Date: Dec. 24, 2013

(87) PCT Pub. No.: WO2012/004432
PCT Pub. Date: Jan. 12, 2012

(65) Prior Publication Data
US 2014/0102636 A1    Apr. 17, 2014

Related U.S. Application Data

(63) Continuation-in-part of application No. PCT/ES2010/070468, filed on Jul. 7, 2010.

(51) Int. Cl.
*B29C 65/02* (2006.01)
*B29C 65/76* (2006.01)
(Continued)

(52) U.S. Cl.
CPC ............... *B01L 3/5027* (2013.01); *B29C 65/76* (2013.01); *B29C 66/028* (2013.01);
(Continued)

(58) Field of Classification Search
USPC .................. 156/230, 247, 249, 285, 286, 305, 156/306.3, 308.2, 308.4
See application file for complete search history.

(56) References Cited

U.S. PATENT DOCUMENTS 6,293,012 B1 * 9/2001 Moles ............... B01L 3/502707
29/890.124
6,619,311 B2 * 9/2003 O'Connor ............. B01L 3/5025
137/109

(Continued)

FOREIGN PATENT DOCUMENTS

WO    WO 2008/052363    5/2008

OTHER PUBLICATIONS

Brown et al., "Fabrication and characterization of poly(methylmethacrylate) microfluidic devices bonded using surface modifications and solvents", *Lab Chip*, vol. 6, 2006, pp. 66-73.
(Continued)

*Primary Examiner* — Sing P Chan
(74) *Attorney, Agent, or Firm* — Merchant & Gould P.C.

(57) ABSTRACT

Fabrication method of microfluidic devices consisting of a sheet (1) which is 200 micrometer thick or less and a rigid part (3), both made of thermoplastic polymeric material includes degasification of a polymeric sheet of thermoplastic material (1), an auxiliary rigid part (2), and a polymeric rigid part of thermoplastic material (3). A temporary bonding procedure, of the degassed thermoplastic polymeric sheet (1) to a degassed auxiliary rigid part (2), is conducted producing a sheet-auxiliary part set (4). A permanent bonding procedure bonds the thermoplastic polymeric sheet (1) of the sheet-auxiliary part set (4) obtained in the previous temporary bonding stage, to the thermoplastic polymeric rigid part (3) which was initially degassed. The auxiliary rigid part (2) of the thermoplastic polymeric sheet (1) permanently bonded to the thermoplastic rigid part (3), is detached to produce a final part which is completely polymeric (5).

10 Claims, 2 Drawing Sheets

(51) Int. Cl.
    *B32B 37/10*     (2006.01)
    *B32B 38/10*     (2006.01)
    *C09J 5/02*     (2006.01)
    *C08J 5/00*     (2006.01)
    *B01L 3/00*     (2006.01)
    *B29C 65/00*     (2006.01)
    *B81C 3/00*     (2006.01)
    *F16K 99/00*     (2006.01)
    *B29L 31/00*     (2006.01)

(52) U.S. Cl.
CPC ............ *B29C 66/112* (2013.01); *B29C 66/114* (2013.01); *B29C 66/53461* (2013.01); *B29C 66/73921* (2013.01); *B81C 3/001* (2013.01); *F16K 99/0001* (2013.01); *F16K 99/0015* (2013.01); *B29C 66/7352* (2013.01); *B29L 2031/756* (2013.01); *B81B 2201/054* (2013.01); *B81C 2203/032* (2013.01); *B81C 2203/036* (2013.01); *F16K 2099/008* (2013.01); *F16K 2099/0084* (2013.01); *F16K 2099/0094* (2013.01)

(56) References Cited

U.S. PATENT DOCUMENTS

| | | | | |
|---|---|---|---|---|
| 6,875,619 | B2* | 4/2005 | Blackburn | B01J 19/0093 435/287.1 |
| 7,470,518 | B2* | 12/2008 | Chiu | B01L 3/5025 422/502 |
| 7,507,380 | B2* | 3/2009 | Chang | B01F 5/0475 422/129 |
| 7,591,947 | B2* | 9/2009 | Caze | B01D 61/18 210/321.75 |
| 7,594,314 | B2* | 9/2009 | Burger | B01L 3/502707 156/153 |
| 7,608,160 | B2* | 10/2009 | Zhou | B01F 5/0683 156/272.2 |
| 7,709,134 | B2* | 5/2010 | Minteer | H01M 4/8605 429/401 |
| 8,043,846 | B2* | 10/2011 | Irimia | B01F 13/0066 366/DIG. 2 |
| 8,084,085 | B2* | 12/2011 | Remy | B01J 19/0093 427/235 |
| 8,388,908 | B2* | 3/2013 | Blaga | B01L 3/502738 422/502 |
| 8,512,502 | B2* | 8/2013 | Young | B01F 5/0683 156/272.2 |
| 8,580,209 | B2* | 11/2013 | Kurowski | B01L 3/502707 156/309.6 |
| 8,956,577 | B2* | 2/2015 | Kokini | B29C 66/7394 422/503 |
| 2002/0166585 | A1* | 11/2002 | O'Connor | B01L 3/5025 137/87.01 |
| 2002/0176804 | A1* | 11/2002 | Strand | B01J 19/0093 422/400 |
| 2003/0190608 | A1* | 10/2003 | Blackburn | B01J 19/0093 435/6.11 |
| 2004/0241049 | A1* | 12/2004 | Carvalho | B01L 3/502707 422/400 |
| 2005/0009101 | A1* | 1/2005 | Blackburn | B01L 3/5027 435/7.1 |
| 2005/0167354 | A1* | 8/2005 | Caze | B01D 61/18 210/321.84 |
| 2005/0170142 | A1* | 8/2005 | Remy | B01J 19/0093 428/141 |
| 2005/0220681 | A1* | 10/2005 | Chang | B01F 5/0475 422/187 |
| 2006/0065528 | A1* | 3/2006 | Lopez | G01N 27/44791 204/450 |
| 2006/0234298 | A1* | 10/2006 | Chiu | B01L 3/5025 435/7.1 |
| 2006/0240548 | A1* | 10/2006 | Deutsch | B01L 3/5027 435/305.2 |
| 2007/0084706 | A1* | 4/2007 | Takayama | B01L 3/502738 200/182 |
| 2007/0099289 | A1* | 5/2007 | Irimia | B01F 13/0066 435/287.2 |
| 2007/0122314 | A1* | 5/2007 | Strand | B01J 19/0093 422/400 |
| 2007/0178133 | A1* | 8/2007 | Rolland | A61L 27/18 424/423 |
| 2007/0287034 | A1* | 12/2007 | Minteer | H01M 4/8605 429/2 |
| 2008/0047836 | A1* | 2/2008 | Strand | B01L 3/502715 204/644 |
| 2009/0056861 | A1 | 3/2009 | Young et al. | |
| 2009/0087924 | A1* | 4/2009 | Bynum | G01N 33/54386 436/518 |
| 2009/0178934 | A1* | 7/2009 | Jarvius | B01L 3/502707 205/777.5 |
| 2010/0210008 | A1* | 8/2010 | Strand | B01L 3/502715 435/287.1 |
| 2010/0303687 | A1* | 12/2010 | Blaga | B01L 3/502738 422/504 |
| 2011/0155667 | A1* | 6/2011 | Charest | A61M 1/16 210/651 |
| 2012/0135446 | A1* | 5/2012 | Collins | B01L 3/502776 435/29 |
| 2012/0321536 | A1* | 12/2012 | Kokini | B29C 66/7394 422/502 |
| 2013/0317130 | A1* | 11/2013 | Brassard | B29C 43/021 521/146 |
| 2014/0287966 | A1* | 9/2014 | Gray | B01L 3/502738 506/39 |
| 2015/0001083 | A1* | 1/2015 | Martin | G01N 27/44791 204/601 |
| 2015/0108056 | A1* | 4/2015 | Charest | A61M 1/16 210/257.2 |
| 2015/0111239 | A1* | 4/2015 | Collins | B01L 3/502776 435/29 |

OTHER PUBLICATIONS

International Search Report from International Application No. PCT/ES2011/070291 mailed Oct. 26, 2011.
Lee et al., "A polymer lab-on-a-chip for reverse transcription (RT)-PCR based point-of-care clinical diagnostics", *Lab on a Chip*, vol. 8, 2008, pp. 2121-2127.
Shao et al., "Rapid prototyping of micro/nano polu (methyl methacrylate) fluidic systems using proton beam writing", *Nuclear Instruments and Methods in Physics Research B*, vol. 260, 2007, pp. 362-365.
Simone et al., "A microvalve for hybrid microfluidic systems", *Microsyst Technol*, vol. 16, 2010, pp. 1269-1276.

\* cited by examiner

FABRICATION METHOD OF MICROFLUIDIC DEVICES

This application is a National Stage Application of PCT/ES2011/070291, filed 25 Apr. 2011, which claims benefit of Serial No. PCT/ES2010/070468, filed 7 Jul. 2010 and which applications are incorporated herein by reference. To the extent appropriate, a claim of priority is made to each of the above disclosed applications.

FIELD OF THE INVENTION

The present invention refers to a joint fabrication method in only one step and without any need of alignment of microfluidic devices through a process of permanent bonding between a sheet with a thickness equal to or smaller than 200 micrometers and a rigid part of thermoplastic materials so that the sheet is completely flat.

BACKGROUND OF THE INVENTION

The bonding of the two rigid parts of thermoplastic materials through thermocompression is published in Soo Hyun Lee et al "A polymer lab-on-a-chip for reverse transcription (RT)-PCR based point-of-care clinical diagnostics", The Royal Society of Chemistry 2008, Lab Chip, 2008, 8, 2121-2127. By using two rigid and thick parts (around one millimeter), in the case of requiring the heating of liquids or gases inside the device, from an element located outside the fluidic structure, this is hindered as it has to go through a low thermal conductivity plastic material, which is considerably thick (several hundreds of micrometers). Also, there are not parts which can be moved for their use as fluidic control elements (valves, pumps, . . . ) for the same reason.

When one of the two thermoplastic parts to be bonded is less than 200 micron thick (sheet) the bonding process through thermocompression causes the permanent deformation of the sheet, preventing the fabrication of the device with a flat finishing surface. The temperatures required for the permanent bonding between the sheet and the thermoplastic part causes said deformation. The deformation of said membrane is counterproductive for many applications (lack of dimensional reproducibility, poor heat transmission due to a bad contact with the heating element, creating of bubbles in the case of being used for the fabrication of microfluidic chips, inappropriate transmission of an optical signal due to the curvature of the membrane sealing a possible reaction chamber, etc.).

The bonding of the two rigid parts of thermoplastic materials through solvent is published in Brown L et al. "Fabrication and characterization of poly(methylmethacrylate) microfluidic devices bonded using surface modifications and solvents", The Royal Society of Chemistry, 2006, Lab Chip 6, 66-73. The parts used are rigid and thick and the dissolution used is applied on the microfabricated structure. Then, it is necessary to align the parts and submit them to pressure and temperature for 30 minutes, followed by a cooling ramp. The fabrication method and characteristics of the substrates do not allow parts which can be moved.

DESCRIPTION OF THE INVENTION

The fabrication method of the present invention solves the aforementioned problems and is based on:
Initial degasification of:
  a polymeric sheet of thermoplastic material
  an auxiliary rigid part
  a polymeric rigid part of thermoplastic material
Bonding through a temporary bonding procedure, of the degassed thermoplastic polymeric sheet to a degassed auxiliary rigid part, producing a sheet-auxiliary part set,
Bonding through a permanent bonding procedure, of the thermoplastic polymeric sheet of the sheet-auxiliary part set obtained in the previous temporary bonding stage, to the thermoplastic polymeric rigid part which was initially degassed,
Detaching the auxiliary rigid part of the thermoplastic polymeric sheet permanently bonded to the thermoplastic rigid part, to produce a final part which is completely polymeric.

The procedure of the invention with permanent bonding of a flexible thermoplastic polymeric sheet of the sheet-auxiliary part set with a thermoplastic polymeric rigid part, prevents the sheet from being curved, forming chambers, microvalves and micropumps without adhesive and without any need of alignment. It refers to the fabrication of microfluidic devices without the use of adhesives where the layer sealing the existing channels and chambers (cover) is 200 micrometer thick or less, with a deformation which can be less than 1 micrometer with respect to the horizontal plane.

In this way, it is possible to:
Heat the liquids present in the device through the cover, since its reduced thickness allows an efficient heat transfer.
Since the sheet maintains a completely flat surface (deformations of less than one micrometer), contact with a heating element is possible without the presence of any trapped air, which would hinder the transmission of heat to the device.
Use the cover as a mobile element for its use in fluidic control devices such as valves and pumps.
Obtain an optically flat cover for optical test done inside the chip chambers.
Obtain dimensional reproducibility from chip to chip facilitating any type of transduction: mechanical, optical, thermal, etc. This characteristic is very important given that chips are generally disposable and once they have been used they need to be replaced by new ones.

As no adhesive is used, no foreign compound is introduced in the fluidic circuit which could interact with the sample, but only the fluid is in contact with the structural material of the device.

On the other hand, the fabrication of the final part using a sheet without any type of structuring enables the sheet to be placed on the part without needing any alignment of the sheet with the part to obtain the final system, which is very common in the construction of this type of structures, where both parts are structured and need micrometric alignment for them to work correctly.

The procedure of the invention comprises the permanent bonding by solvent or through thermocompression of a thin layer, which is less than 200 micrometers thick, to a part of the same or a similar thermoplastic polymeric material where the necessary microchannels, microchambers and through holes have been previously moulded. In this way, the sheet is used to seal the channels, as a mobile membrane to be used as closing valve, as a mobile membrane to be used to displace fluids, and as fine closing element of a microchamber which allows the possibility of applying cycles of temperature in a fast manner. This flat and reproducible sealing enables an optical signal going through the sheet not to be affected by the curvature or change when different chips are inserted.

The method of fabrication presented in this patent also enables the thin sheet to be completely flat. This is particularly complicated when the bonding is made through thermocompression, since when the sheet is subjected to high temperature, it naturally tends to deform.

The moulded rigid part is a part of a thermoplastic polymeric material (COC, Cyclo-Olefin Copolymer), COP (Cyclo-Olefin Polymer), PMMA (methacrylate), PC (polycarbonate) etc.) which has been microstructured to form microchannels, microchambers, microvalves or micropumps. This structuring can be made through processes such as hot-embossing, injection moulding, fine machining, or others.

The thin sheet refers to a sheet of the same material as the moulded part (for example, COC, COP, PMMA, PC, etc.), less than 200 micrometer thick, thickness meaning how thick the sheet is.

The moulded part-sheet bonding process comprises:
An initial stage of degasification of:
- a polymeric sheet of thermoplastic material
- an auxiliary rigid part
- a polymeric rigid part of a thermoplastic material through its introduction in a vacuum chamber at a pressure under 500 mbar and/or heating at a temperature selected between room temperature and the glass transition temperature of each part depending on the vacuum pressure used, for a period of time depending on the thickness of the parts (between 1 and 24 hours), to prevent the appearance of bubbles on the surface of the parts A subsequent stage of temporary bonding between the thermoplastic polymeric sheet and an auxiliary rigid part, for example glass, degassed at the initial stage, selected between temporary bonding through thermocompression, ozone assisted temporary bonding and/or electrostatic charge assisted temporary bonding, producing a sheet-auxiliary rigid part set. By rigid part we mean that which does not deform during the mechanical and thermal stress to which it must be subjected during the rest of the process.

a) Non-Permanent Thermocompression:

The thermoplastic polymeric sheet is in contact with the auxiliary rigid part and is subjected to a thermocompression process. Said process consists of subjecting both materials to a temperature close to the glass transition temperature (Tg) of the thermoplastic sheet, where "close to the glass transition temperature" means the glass temperature Tg±5° C., and to a pressure between 0.1 and 10 bar. As a result, the sheet is temporarily flattened to the auxiliary part, it being possible to manually extract it, but with enough adherence strength so as not to allow the sheet to deform during the following bonding process to the rigid thermoplastic part.

b) Ozone- and/or Ultraviolet Light-Assisted Temporary Bonding:

When the thermoplastic polymeric sheet can be activated by contact with ozone (COP, COC, etc.) and/or ultraviolet light, it is possible to make the temporary bonding to a rigid substrate which can be activated by ozone and/or ultraviolet light. In this case, the ultraviolet light power has to be adapted to the size of the parts to be activated and the specific material being used. An excessive power (more than 3 J/cm$^2$) produces an irreversible bonding between the polymeric sheet and the rigid part, while a deficient ultraviolet light power produces the deformation of the sheet during the next bonding process with the rigid part. In the case of a temporary bonding between COP material and Pyrex (Pyrex is the commercial name of a glass that would be used as rigid substrate) the dose must be between 0.7 J/cm$^2$ and 0.9 J/cm$^2$. A smaller dose would not allow attaining the sheet bonding process without the deformation thereof; while a greater dose would make the bonding between the sheet and the Pyrex so strong that their detachment would be impossible without breaking the sheet, Pyrex or both.

c) Electrostatic Charge-Assisted Temporary Bonding:

Another option is the use of ionized gas to electrostatically charge the sheet and a rigid substrate so that they are temporarily adhered. Again, sheet and substrate are temporarily bonded so that the deformation of the sheet is avoided during the bonding process with the thermoplastic rigid part.

A subsequent permanent bonding stage between the sheet of the sheet-auxiliary part set obtained in the previous stage and a polymeric rigid part, which allows the fusion of the sheet of the sheet-auxiliary part set and the degassed polymeric rigid part, without the deformation of the already defined structures of the part. This bonding can be made:

through thermocompression: the polymeric rigid part which has been degassed at the initial stage, is bonded to the thermoplastic polymeric sheet of the sheet-auxiliary part set, applying a temperature close or equal to the glass transition temperature of the thermoplastic (close meaning Tg±5° C.) both for the sheet and for the rigid part, and applying pressure between 0.1 and 10 bar, which allows the fusion between the thermoplastic polymeric sheet and the thermoplastic rigid part without the deformation of the already defined structures in the part (for example, in the case of parts and sheets of COC 5013 the temperature is 130° C. and the pressure is 1bar).

through the application of a solvent such as for example toluene or chlorobenzene: applying a sufficient amount of solvent on the thermoplastic polymeric sheet of the sheet-auxiliary part set which enables to cover the surface and the excess is removed, either centrifuging the sheet at medium speed (<2000 rpm) or spreading the solvent, until it reaches a dry and slightly adhering surface. Later, it is contacted with the thermoplastic polymeric rigid part and they are bonded applying pressure (between 0.1 and 10 bar) which allows the fusion between the sheet and the rigid part without the deformation of the already defined structures in the part (for example, in the case of the sheet of COC 5013, the pressure is 6 bar).

A fourth stage of detachment of the auxiliary rigid part of the thermoplastic polymeric sheet resulting from the temporary bonding between them, to give place to a sheet whose thickness is equal to or greater than 200 microns fixed to a thermoplastic polymeric rigid part, without losing flatness. In this way, a completely polymeric final part is made.

The correct use of the initial stage allows the fabrication of the thermoplastic device without the creation of bubbles in the parts.

With the auxiliary rigid part, the deformation of the thermoplastic polymeric material sheet is prevented during the bonding process with the polymeric rigid part. This is a key process, since it prevents the deformation of the sheet during the bonding process between it and the rigid part. It must be clarified that, in the case of bonding through thermocompression, the thin sheet which is 200 micrometer thick or less tends to deform and curve when it is subjected to the necessary temperature and pressure for its bonding to the thermoplastic polymeric rigid part. In the case of bonding through adhesive, a thin sheet which is 200 micrometer thick or less tends to deform when it is subjected to the necessary pressure for its bonding to the rigid part. Therefore, in order to achieve the sheet to be completely flat, a temporary sealing process to a substrate or auxiliary rigid part is performed, so that the deformation of the sheet is not allowed. For said temporary sealing no adhesive material which may contain air, expand or extend through temperature or pressure can be used, since this would cause the deformation of the membrane during the application of the necessary temperature or pressure during the permanent bonding process to the rigid part through thermocompression or solvent.

Through the permanent bonding stage after the temporary bonding stage of the thermoplastic polymeric sheet with the auxiliary rigid part, it is attained that both, the thermoplastic polymeric sheet and the auxiliary rigid part, are fused in a single device without damaging or modifying the structure made before in the thermoplastic polymeric rigid part or the thickness of the sheet.

The glass transition temperature (Tg) is defined as the temperature at which the polymer stops being rigid and starts to be soft, in the case of thermoplastic polymeric materials the glass transition temperature would have an interval of $Tg\pm5°$ C.

BRIEF DESCRIPTION OF THE DRAWINGS

The following is a brief description of a series of drawings which will help understand the invention better relating to an embodiment of said invention which is presented as a non-limiting example thereof.

DESCRIPTION OF A PREFERRED EMBODIMENT OF THE INVENTION

Figure 1:
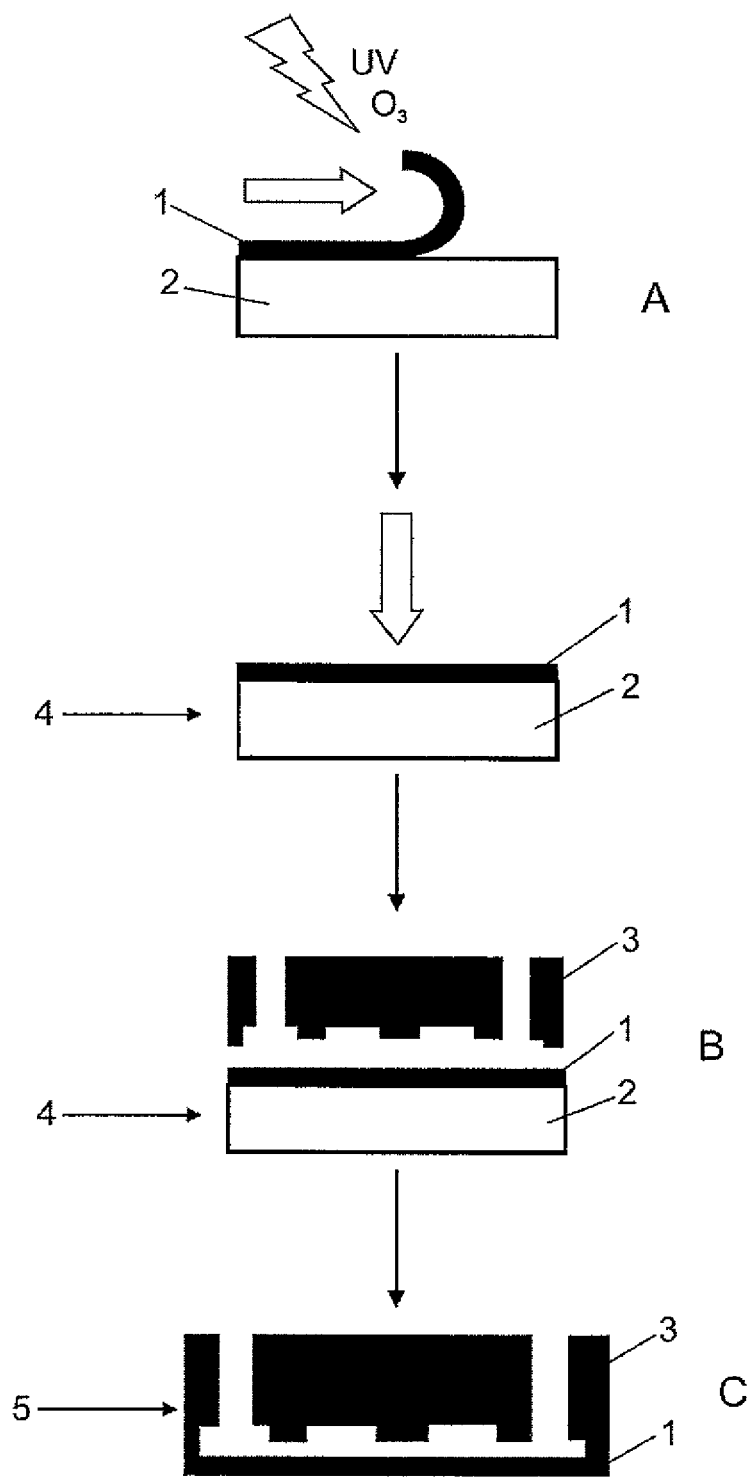
FIG. 1.—Scheme of the stages of the method of the invention until obtaining the sheet-part set.

The following is a description of an example of the fabrication of a microfluidic device through the method described in the present invention as shown in FIG. 1:

The starting point is a polymeric sheet of thermoplastic material (1) which is 100 micron thick and an auxiliary rigid part (2) which is 1 mm thick, both degassed at an initial stage, together with a polymeric rigid part of thermoplastic material (3), through the insertion in a vacuum chamber at 10 mbar and heating at 60° C. for 8 hours.

Next, in a later stage (A), a temporary bonding is performed between the thermoplastic polymeric sheet (1) and the auxiliary rigid part (2) which is 1 mm thick. This temporary bonding is attained subjecting the thermoplastic polymeric sheet (1) for 2 minutes in the presence of ozone and ultraviolet light and in contact with the auxiliary rigid part (2), so that both are temporarily adhered.

As a result, both materials are temporarily adhered, producing a sheet-auxiliary part set (4), adhered with enough strength so as to prevent the deformation of the thermoplastic polymeric sheet (1) during the bonding process to the thermoplastic polymeric rigid part (3) at the later stage, but at the same time easily and manually detachable from the auxiliary rigid part (2).

At a stage after the temporary bonding (B), there is a bonding between the sheet of the sheet-auxiliary part set (4) obtained at the previous stage and the thermoplastic polymeric rigid part (3) degassed at the initial stage. In the case of thermocompression, they are subjected to such pressure and temperature that they allow the permanent sealing between the sheet and part without damaging the structure of the thermoplastic polymeric rigid part or altering the sheet thickness, that is, subjected to a temperature close or equal to the glass transition temperature of the sheet (the term "close" meaning $Tg\pm5°$ C.). In the case of bonding through solvent, applying the solvent to the sheet, contacting them and subjecting them to such a pressure that the permanent sealing between the sheet and the thermoplastic polymeric rigid part without damaging the structure of the rigid part or altering the sheet thickness.

And finally, at a fourth stage, the auxiliary rigid part (2) is detached (D) from the thermoplastic polymeric sheet (1) resulting from the temporary bonding between both at the stage of obtaining the sheet-auxiliary part set (4), to produce a completely polymeric final part (5).

Figure 2A:
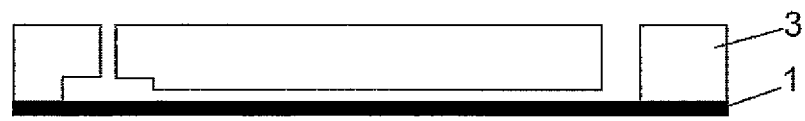
FIG. 2a.—Microfluidic device with an open out-line microvalve.
Figure 2B:
FIG. 2b.—Microfluidic device with the out-line microvalve of FIG. 1a being closed FIG. 3a.—Microfluidic device with an open in-line microvalve FIG. 3b.—Microfluidic device with the in-line microvalve of FIG. 2a being closed FIG. 4a.—Microfluidic device with an open in-line micropump and two microvalves, a first one closed and a second one open FIG. 4b.—Microfluidic device of FIG. 3a with the micropump closed FIG. 4c.—Microfluidic device of FIG. 3a with the micropump open and the first microvalve open and the second one closed The number references represented in the figures correspond to the following elements without this being limiting:
1.—Thermoplastic polymeric sheet
2.—Auxiliary rigid part
3.—Thermoplastic polymeric rigid part
4.—Sheet-auxiliary part set
5.—Completely polymeric final part

Two types of microvalves can be obtained through this device fabrication method:

a) Out-line Microvalve:

It is a microvalve based on the action of a membrane which is on the opposite side, and directly opposite to the fluid insertion or extraction point (see FIGS. 2a and 2b).

Figure 3A:
Figure 3B:

When the membrane is not pressed against the tube, the fluid can go through the device, or vice versa, without any problems. By contrast, when the membrane is pressed, it blocks the passage of the fluid through the inlet tube and the fluid stops.

b) In-line Microvalve:

It refers to a microvalve that blocks the passage of the fluid at a different point to an inlet or outlet tube, that is, it blocks the passage in an inner channel of the device. The solution proposed is based on a bonding of the two sheets at both sides of the part. Said bonding is made only once through the bonding process by thermocompression or solvent (see FIGS. 3a and 3b).

Figure 4A:
Figure 4B:
Figure 4C:
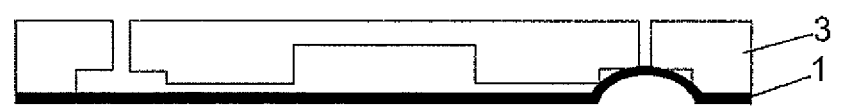

The fabrication method also allows the integration of micropumps based on the creation of a chamber of fixed fluid to be displaced, and two valves, one at each side, defining the direction to which the flow is displaced through their synchronization, as shown in FIGS. 4a, 4b and 4c.

The invention claimed is:

1. Method for manufacturing microfluidic devices including a thermoplastic polymer sheet which is 200 micrometer thick or less used to seal, without adhesive, a channel, and used to form a microvalve or a micropump formed on a rigid part, both made of thermoplastic polymeric material, comprising the stages of:
   initially degasifying:
   a thermoplastic polymeric sheet,
   an auxiliary thermoplastic polymeric rigid part, a thermoplastic polymeric rigid part of thermoplastic material;

bonding without adhesive through a temporary bonding procedure, of the degassed thermoplastic polymeric sheet to the degassed auxiliary thermoplastic polymeric rigid part, obtaining a sheet-auxiliary part set;

bonding without adhesive through a permanent bonding procedure, of the thermoplastic polymeric sheet of the sheet-auxiliary part set obtained in the previous temporary bonding stage, to the thermoplastic polymeric rigid part which was initially degassed;

detaching the auxiliary thermoplastic polymeric rigid part of the thermoplastic polymeric sheet permanently bonded to the thermoplastic polymeric rigid part, to produce a final part which is completely polymeric.

2. The method of manufacturing according to claim 1, wherein the permanent bonding procedure comprises:
   applying a solvent on the thermoplastic polymeric sheet of the sheet-auxiliary part set,
   removing any excess solvent until a dry and slightly adherent surface is attained,
   contacting the sheet-auxiliary part set with the thermoplastic polymeric rigid part,
   applying pressure on both parts in contact.

3. The method of manufacturing according to claim 2, wherein the pressure applied is between 0.1 bar and 10 bar.

4. The method of manufacturing according to claim 1, wherein the permanent bonding procedure is through thermocompression and comprises:
   contacting the sheet-auxiliary part set with the thermoplastic polymeric rigid part,
   applying a temperature close or equal to the glass transition temperature of the thermoplastic polymeric sheet and of the thermoplastic polymeric rigid part,
   applying a pressure between 0.1 bar and 10 bar which allows the fusion between the thermoplastic polymeric sheet and of the thermoplastic polymeric rigid part.

5. The method of manufacturing according to claim 1, wherein the degasification is made by insertion of the parts in a vacuum chamber or heating at a temperature selected between room temperature and the glass transition temperature of each part.

6. The method of manufacturing according claim 1, wherein the temporary bonding is performed through non-permanent thermocompression between the thermoplastic polymeric sheet and the auxiliary thermoplastic polymeric rigid part, at a temperature close or equal to the glass transition temperature of the thermoplastic polymeric sheet and at a pressure between 0.1 bar and 10 bar.

7. The method of manufacturing according to claim 1, wherein the temporary bonding is performed through ozone-assisted temporary bonding.

8. The method of manufacturing according to claim 7, wherein the thermoplastic polymeric sheet is cyclo-olefin copolymer or cyclo-olefin polymer.

9. The method of manufacturing according to claim 1, wherein the temporary bonding is performed through electrostatic charge-assisted temporary bonding.

10. The method of manufacturing according to claim 1, wherein the degasification is made by insertion of the parts in a vacuum chamber and heating at a temperature selected between room temperature and the glass transition temperature of each part.

* * * * *